(12) United States Patent
Yoo et al.

(10) Patent No.: US 9,609,735 B2
(45) Date of Patent: Mar. 28, 2017

(54) ELECTRODE SUBSTRATE AND TOUCH PANEL

(71) Applicant: LG INNOTEK CO., LTD., Seoul (KR)

(72) Inventors: Kyoung Jong Yoo, Seoul (KR); Jin Su Kim, Seoul (KR); Young Jae Lee, Seoul (KR); Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 668 days.

(21) Appl. No.: 13/927,276

(22) Filed: Jun. 26, 2013

(65) Prior Publication Data
US 2014/0000938 A1    Jan. 2, 2014

(30) Foreign Application Priority Data
Jun. 27, 2012 (KR) .................. 10-2012-0069269

(51) Int. Cl.
*H05K 1/02* (2006.01)
*G06F 3/041* (2006.01)
*H05K 3/06* (2006.01)

(52) U.S. Cl.
CPC ............... *H05K 1/02* (2013.01); *G06F 3/041* (2013.01); *H05K 1/0296* (2013.01); *G06F 2203/04103* (2013.01); *G06F 2203/04112* (2013.01); *H05K 1/0289* (2013.01); *H05K 3/06* (2013.01); *H05K 2203/0113* (2013.01)

(58) Field of Classification Search
CPC .... H05K 1/02; H05K 3/06; H05K 2203/0113; G06F 3/041; G06F 2203/04103; G06F 2203/04112

USPC ................................... 174/250–268
See application file for complete search history.

(56) References Cited

U.S. PATENT DOCUMENTS

| 7,193,157 B2 * | 3/2007 | Matsuda | H01L 23/4985 174/254 |
| 8,947,370 B2 * | 2/2015 | An | G06F 3/044 178/18.01 |
| 2004/0259276 A1 | 12/2004 | Yue et al. | |
| 2009/0218310 A1 | 9/2009 | Zu et al. | |
| 2010/0244269 A1 | 9/2010 | Kim | |
| 2010/0327396 A1 | 12/2010 | Park et al. | |

FOREIGN PATENT DOCUMENTS

| CN | 201725318 U | 1/2011 |
| JP | 2012-204170 A | 10/2012 |
| JP | 2013-239138 A | 11/2013 |
| TW | M387310 U1 | 8/2010 |
| TW | M425341 U1 | 3/2012 |
| WO | WO-2013/146331 A1 | 10/2013 |

OTHER PUBLICATIONS

Claims of U.S. Appl. No. 14/095,490, as amended on Jul. 27, 2016.*

(Continued)

*Primary Examiner* — Ishwarbhai B Patel
(74) *Attorney, Agent, or Firm* — Saliwanchik, Lloyd & Eisenschenk

(57) ABSTRACT

Provided is an electrode substrate, including: a substrate; a first pattern unit on the substrate; and a second pattern unit on the substrate.

10 Claims, 4 Drawing Sheets

(56) References Cited

OTHER PUBLICATIONS

Chen L., Flexible imaging transparent conductive film, has conductive material provided with conductive ink and conductive film part, conductive network covered by conductive film part, and transmitting area provided at outer side of groove, XP002730427, vol. 2011, NR:79, Publisher Accession No. 2011-P36586, Nanchang O-Film Tech Co Ltd.
Office Action dated Nov. 2, 2016 in Taiwanese Application No. 102123016.

* cited by examiner (a)

(b)

(a)

(b)

ELECTRODE SUBSTRATE AND TOUCH PANEL

CROSS-REFERENCE TO RELATED APPLICATION

This application claims the benefit under 35 U.S.C. §119 of Korean Patent Application No. 10-2012-0069269, filed Jun. 27, 2012, which is hereby incorporated by reference in its entirety.

BACKGROUND

Field of the Invention

The present invention relates to an electrode substrate and touch panel, more specifically, to an electrode substrate and touch panel, which has excellent conductive and optical properties.

Description of the Related Arts

A touch panel is installed on a display surface of an image display unit such as an LCD (Liquid Crystal Display) device, an FED (Field Emission Display) device, a PDP (Plasma Display Panel) and an ELD (Electro Luminescence Device), and is a device which is configured such that the user inputs predetermined information in a computer using the touch panel while showing the image display unit. Recently, the touch panel has been widely used in communication terminals such as a smart phone or a touch phone for which touch commands are necessarily required.

In general, a transparent conductive component used in a display area of a touch panel has been produced by a deposition process for depositing an ITO (Indium Tin Oxide) on a transparent glass or film.

More specifically, in the conventional touch panel, the ITO was used as a transparent electrode, and a low-resistance metal wiring electrode and an ITO transparent electrode pattern were formed by repeating a photolithography process several times.

However, due to the recent short supply of indium, which is a main material of the ITO, it has been expected that a production cost will increase from now on. Also, a flexible display device having flexibility has been widely recognized as a leading product in future markets, but the ITO, which has been widely used, lacks flexibility, so it is problematic that the ITO is not appropriate for the flexible display device.

In a way, researches for a method of implementing the display device using an Ag ink printing method for replacing the ITO electrode and reducing the production cost have been carried out. However, due to the securing of penetrability and electric resistance, the method is problematic.

BRIEF SUMMARY

Accordingly, the present invention has been made keeping in mind the above problems occurring in the related art. An aspect of the present invention provides an electrode substrate, which is configured such that a process is minimized by excluding a complex photolithography process upon manufacturing of the electrode substrate of the touch panel, and a nano fine electrode pattern is formed using a difference in etching speed caused by a difference in line width of patterns resulting from using a wet etching process to a metal material having an excellent electrical property, thereby enabling the electrode substrate of the touch panel to have more excellent conductive and optical properties than a conventional ITO electrode.

Another aspect of the present invention provides an electrode substrate for a display device having flexibility.

According to an aspect of the present invention, there is provided An electrode substrate, comprising: a substrate; a first pattern unit on the substrate; and a second pattern unit on the substrate.

According to one embodiment of the present invention, the second pattern unit may have a width formed larger than that of the first pattern unit.

According to another embodiment of the present invention, the second pattern unit may have a height formed larger than that of the first pattern unit.

According to still further another embodiment of the present invention, at least one of the first pattern unit and the second pattern unit may be configured such that a height of the at least one is formed larger than a width thereof.

According to still further another embodiment of the present invention, the electrode substrate may further include an electrode formed of a metal material in an upper part of the second pattern unit.

According to still further another embodiment of the present invention, the electrode may have a height of 100 to 300 nm.

According to still further another embodiment of the present invention, the electrode may be a wiring electrode or a sensing electrode.

According to still further another embodiment of the present invention, the wiring electrode may have a width formed narrower than that of the sensing electrode.

According to still further another embodiment of the present invention, the width of the wiring electrode may be formed in the range of 20 μm to 40 μm.

According to still further another embodiment of the present invention, the width of the sensing electrode may be formed in the range of 500 nm to 5 μm.

According to still further another embodiment of the present invention, the first pattern unit may be a line pattern or an isolated pattern.

According to still further another embodiment of the present invention, the first pattern unit and the second pattern may be composed of a UV curing resin.

According to still further another embodiment of the present invention, a cross section of the plurality of pattern units has a shape having a curvature.

According to another aspect of the present invention, there is provided a touch panel, including at least one or more electrode substrates that comprise: a substrate; a first pattern unit on the substrate; and a second pattern unit on the substrate.

According to one embodiment of the present invention, the touch panel may further include a flexible printed circuit board (FPCB) for connecting the electrode substrates and a driving circuit.

According to another embodiment of the present invention, the electrode substrates may be configured of a first electrode substrate and a second electrode substrate.

According to still another embodiment of the present invention, the electrode substrates may be configured of a first surface or a second surface, and at least one of the first surface and the second surface may include the first pattern unit and the second pattern unit.

According to still another aspect of the present invention, there is provided a display device, including: at least one or more electrode substrates that comprise: a substrate; a first pattern unit on the substrate; and a second pattern unit on the substrate; and a driving unit for driving the electrode substrates.

According to the embodiments of the present invention, the electrode substrate of the touch panel, which has more excellent conductive and optical properties than a conventional ITO electrode, can be produced in such a manner that a process is minimized by excluding a complex photolithography process upon manufacturing of the electrode substrate of the touch panel, and a nano fine electrode pattern is formed using a difference in etching speed caused by a difference in line width of patterns resulting from using a wet etching process to a metal material having an excellent electrical property.

Also, according to the embodiments of the present invention, the electrode substrate for a display device having flexibility can be produced.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
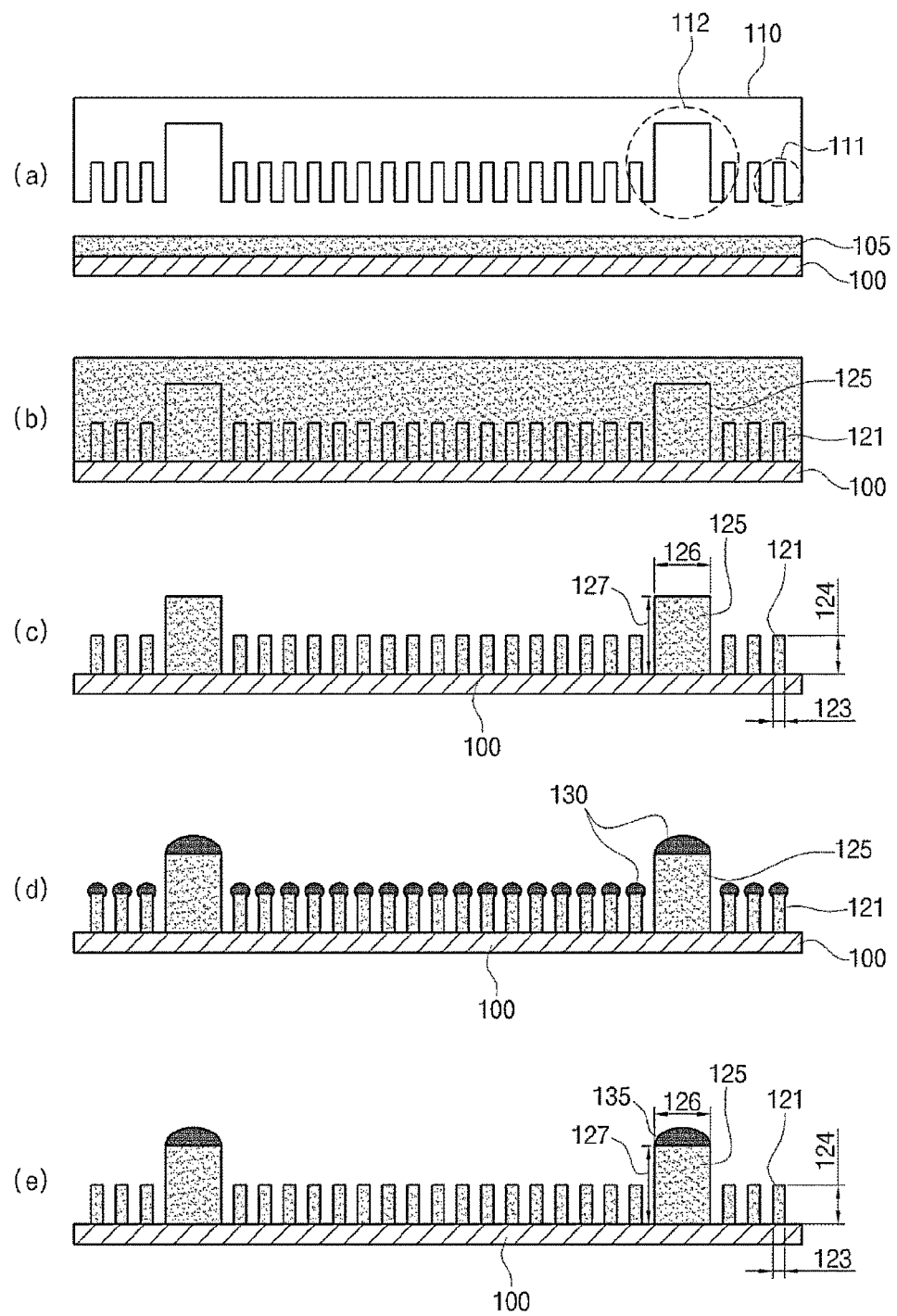
FIG. 1 is a view for explaining a method of manufacturing an electrode substrate according to one embodiment of the present invention.

Hereinafter, preferred embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted. Further, it should be understood that the shape and size of the elements shown in the drawings may be exaggeratedly drawn to provide an easily understood description of the structure of the present invention rather than reflecting the actual sizes of the corresponding elements.

FIG. 1 is a view for explaining a method of manufacturing an electrode substrate according to one embodiment of the present invention.

The method of manufacturing the electrode substrate according to the present embodiment of the invention will be hereinafter explained with reference to FIG. 1.

As illustrated in (a) of FIG. 1, a mold 110 according to the present embodiment of the invention includes a first mold pattern unit 111 and a second mold pattern unit 112. At this time, after the first mold pattern unit 111 is formed by a first process, the second mold pattern unit 112 is formed by a second process.

The first mold pattern unit 111 is an element for forming a first pattern unit 121 illustrated in (b) of FIG. 1 through an imprinting process, and the second mold pattern unit 112 is an element for forming a second pattern unit 125 illustrated in (b) of FIG. 1 through an imprinting process.

That is, the mold 110 according to the present embodiment of the invention includes the first mold pattern unit 111 for forming the first pattern unit on an UV curing resin layer 105 and the second mold pattern unit 112 for forming the second pattern unit on the UV curing resin layer 105.

At this time, the first mold pattern unit 111 may be formed using an E-beam method, an interference method or a spacer lithography method. The second mold pattern unit 112 may be formed using an E-beam method, a laser writing method or a photolithography method.

After this, as illustrated in (b) of FIG. 1, the first pattern unit 121 and the second pattern unit 125 are formed by imprinting the mold 110 on the UV curing resin layer 105.

More specifically, when the UV curing resin layer 105 is formed by coating a substrate 100 with an UV curing resin, the UV curing resin is filled between the mold pattern units 111, 112 formed in the mold 110 by applying pressure to the UV curing resin layer 105 using the mold 110.

After this, when the UV curing resin filled between the mold pattern units of the mold 110 is cured by irradiating ultraviolet rays thereto, as illustrated in (c) of FIG. 1, the first pattern unit 121 and the second pattern unit 125 are formed.

At this time, a width 126 and a height 127 of the second pattern unit 125 are formed larger than a width 123 and a height 124 of the first pattern unit 121.

Hereinafter, as illustrated in (d) of FIG. 1, a metal material 130 is deposited on each upper part of the first pattern unit 121 and the second pattern unit 125.

At this time, the metal material 130 deposited on each upper part of the first pattern unit 121 and the second pattern unit 125 may have a height of 100 to 300 nm so that adjacent metal materials are not in contact with each other.

After this, as illustrated in (e) of FIG. 1, a wet etching process for the metal material 130 deposited on each upper part of the first pattern unit 121 and the second pattern unit 125 are carried out.

At this time, the metal material 130 deposited on each upper part of the first pattern unit 121 is removed by the wet etching process. However, since the metal material deposited on the upper part of the second pattern unit 125 is partially removed by the wet etching process, the metal material 130 is left, thereby forming an electrode 135.

That is, since a difference in etching speed is generated due to a difference in line width between the first pattern unit 12 and the second pattern unit resulting from the wet etching process, the metal material 130 of the upper part of the first pattern unit 121 is removed, but the metal material 130 of the upper part of the second pattern unit 125 is left so that the electrode is formed. At this time, the formed electrode 135 may be a sensing electrode for sensing a touch command or a wiring electrode for transmitting a sensing signal from the sensing electrode.

Hereinafter, the configuration of the electrode substrate of the touch panel according to the present embodiment of the invention will be explained with reference to (e) of FIG. 1.

As illustrated in (e) of FIG. 1, the electrode substrate of the touch panel according to the present embodiment of the invention includes the substrate 100, the first pattern unit 121, the second pattern unit 125 and the electrode 135.

The first pattern unit 121 and the second pattern unit 125 are formed in an upper part of the substrate 100.

The first pattern unit 121 and the second pattern unit 125 are formed of an UV curing resin. At this time, the width 126 and the height 127 of the second pattern unit 125 are formed larger than the width 123 or the height 124 of the first pattern unit 121.

The electrode 135 composed of the metal material is formed in the upper part of the second pattern unit 125, which is formed as described above. In order to form the electrode 135, the metal material is deposited on each upper part of the first pattern unit 121 and the second pattern unit 125, and thereafter, the wet etching process therefor is carried. Thus, only the metal material of the upper part of the second pattern unit 125 is left so the electrode 135 is formed. That is, according to the present embodiment of the invention, a nano fine electrode is formed using a difference in etching speed caused by a difference in line width between the patterns resulting from using the wet etching process to the metal material.

In a way, the electrode 135, which is formed as described above, may be a sensing electrode for sensing a touch command or a wiring electrode for transmitting a sensing signal from the sensing electrode.

At this time, when the nano fine electrode is formed using the difference in etching speed, the wiring electrode may have a width of 20 μm to 40 μm, and the sensing electrode may have a width of 500 nm to 5 μm.

Figure 2:
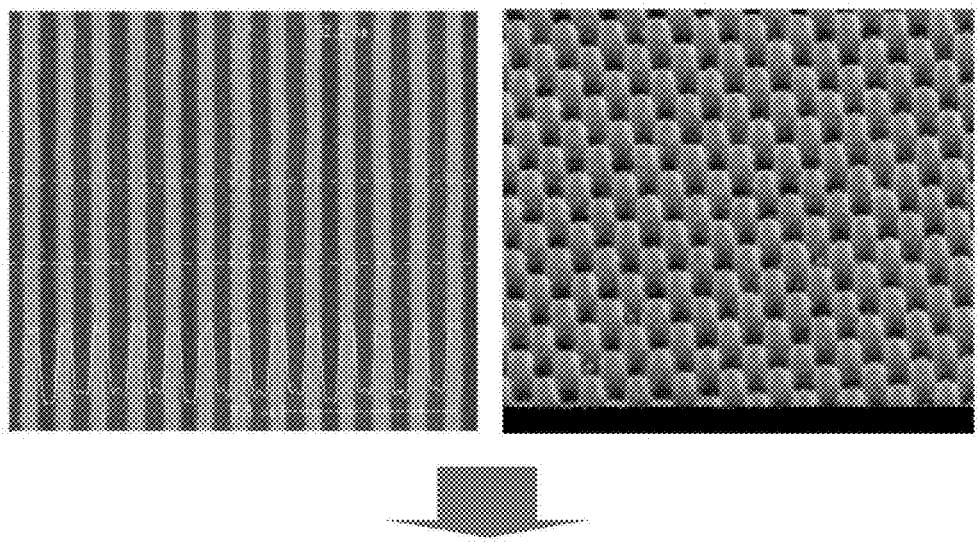
FIG. 2 is a view illustrating a mold according to another embodiment of the present invention.
Figure 2:
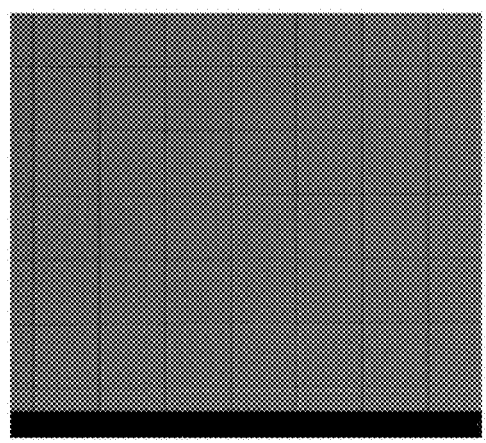

Like this, when the width of the wiring electrode is formed of the fine electrode of 20 μm to 40 μm, a bezel of the touch panel in which the electrode substrate according to the present embodiment of the invention is used may be minimized. When the width of the sensing electrode is formed in the range of 500 nm to 5 μm, the sensing electrode is not visible to the user's eye. FIG. 2 is a view illustrating the mold according to another embodiment of the present invention.

According to the present embodiment of the invention, upon forming of the mold, as illustrated in (a) of FIG. 2, the first mold pattern unit is first formed.

At this time, the first mold pattern unit may be formed using an E-beam method, an interference method or a spacer lithography method. The first mold pattern unit may be composed of line/space or dot patterns having a cycle of less than 1 μm through these process methods.

As described above, after the performing of the first process, the second mold pattern unit as illustrated in (b) of FIG. 2 is formed.

The second mold pattern unit may be formed using an E-beam method, a laser writing method or photolithography method. The second mold pattern unit has a width (line) 20 μm to 40 μm at a part where the wiring electrode among the electrodes is formed, and has a width (line) of 500 nm to 5 μm at a part where the sensing electrode.

Figure 3:
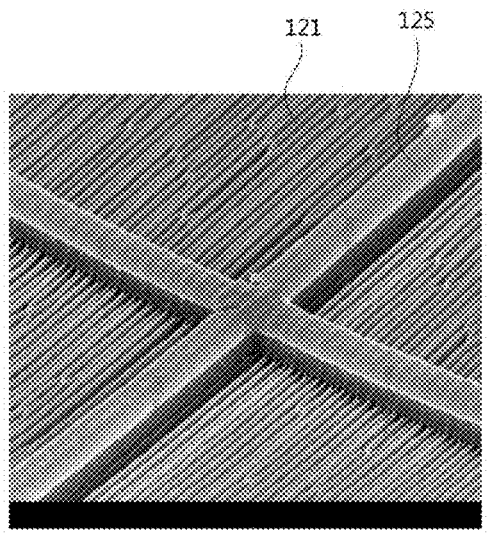
FIG. 3 is a view illustrating a UV curing resin layer including a first pattern unit and a second pattern unit according to still another embodiment of the present invention.
Figure 4:
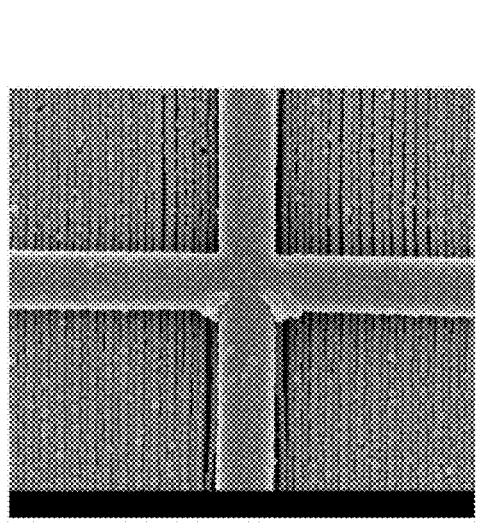
FIG. 4 is a view in which a metal material is deposited on each upper part of the first pattern unit and the second pattern unit according to still further another embodiment.
Figure 4:
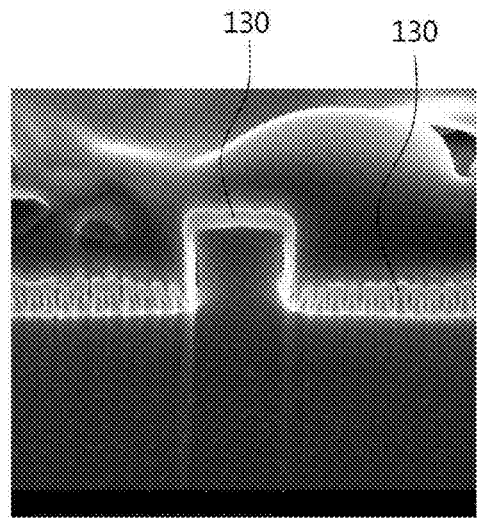
Figure 5:
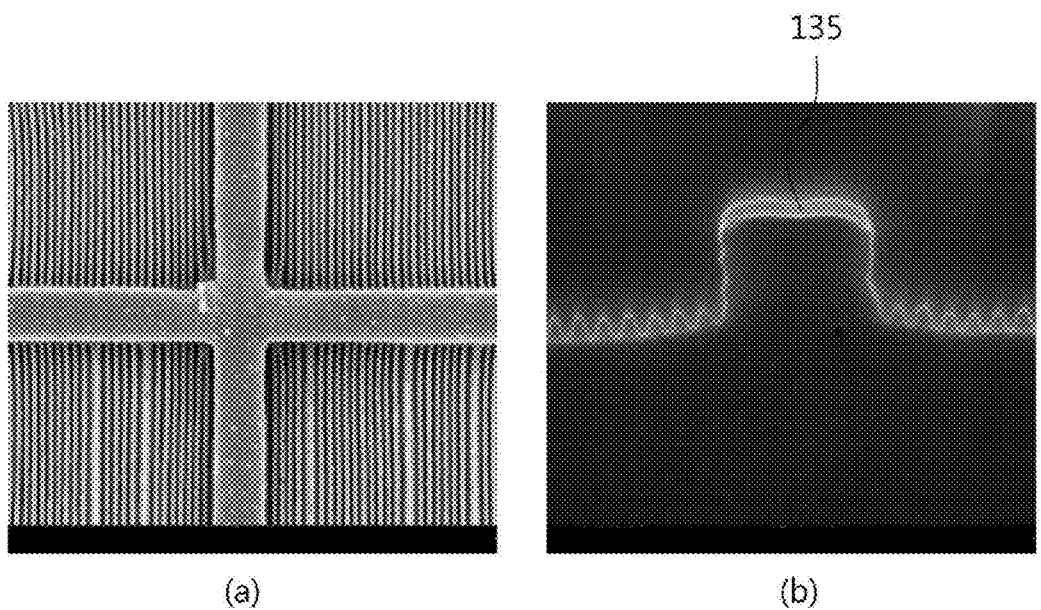
FIG. 5 is view in which an electrode according to still further another embodiment of the present invention is formed.

FIG. 3 is a view illustrating the UV curing resin layer including the first pattern unit and the second pattern unit according to still another embodiment of the present invention, FIG. 4 is a view in which the metal material is deposited on each upper part of the first pattern unit and the second pattern unit according to still further another embodiment, and FIG. 5 is view in which an electrode according to still further another embodiment of the present invention is formed.

When the UV curing resin layer is formed by coating the substrate with the UV curing resin, the UV curing resin is filled between the mold pattern units formed in the mold by applying pressure to the UV curing resin layer using the mold, and the UV curing resin filled between the mold pattern units is cured by irradiating ultraviolet rays thereto, so the UV curing resin layer having the first pattern unit 121 and the second pattern unit 135 is formed as illustrated in FIG. 3.

After this, as illustrated in (a) of FIG. 4, the metal material is deposited on each upper part of the first pattern unit and the second pattern unit, and thus as illustrated in a cross-sectional view of (b) of FIG. 4, it could be confirmed that the metal material 130 is deposited on each upper part of the first pattern unit and the second pattern unit.

After this, as illustrated in (a) of FIG. 5, the wet etching process for the metal material is carried out. Thus, as illustrated in a cross-sectional view of (b) of FIG. 5, the metal material on the first pattern unit is completely removed, whereas the metal material of the upper part of the second pattern unit the electrode 135 is left, so the electrode 135 is formed due to the metal material.

Accordingly, according to the embodiments of the present invention, the electrode panel of the touch panel, which has more excellent conductive and optical properties than the conventional ITO electrode, can be produced because the nano fine electrode pattern is formed using the difference in etching speed caused by the difference in line width between the patterns resulting from using the wet etching process to the metal material having an excellent electrical property.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:
1. An electrode substrate, comprising:
a substrate;
a first pattern unit on the substrate; and
a second pattern unit on the substrate,
wherein the second pattern unit has a width formed larger than that of the first pattern unit,
wherein the second pattern unit has a height formed larger than that of the first pattern unit, and
wherein an electrode is only disposed on the second pattern unit.
2. The electrode substrate according to claim 1, wherein the electrode is formed of a metal material in an upper part of the second pattern unit.
3. The electrode substrate according to claim 1, wherein the electrode has a height in a range of 100 to 300 nm.
4. The electrode substrate according to claim 1, wherein the electrode is a wiring electrode or a sensing electrode.
5. The electrode substrate according to claim 1, wherein the electrode comprises a wiring electrode and a sensing electrode, and
wherein the wiring electrode has a width formed narrower than that of the sensing electrode.
6. The electrode substrate according to claim 1, wherein the electrode comprises a wiring electrode and a sensing electrode,
wherein the width of the wiring electrode is formed in a range of 20 μm to 40 μm.
7. The electrode substrate according to claim 1, wherein the electrode comprises a wiring electrode and a sensing electrode, and wherein the width of the sensing electrode is formed in a range of 500 nm to 5 μm.

8. The electrode substrate according to claim 1, wherein the first pattern unit is a line pattern or an isolated pattern.

9. The electrode substrate according to claim 1, wherein the first pattern unit and the second pattern are composed of a UV curing resin.

10. The electrode substrate according to claim 1, wherein a cross section of the plurality of pattern units has a shape having a curvature.

* * * * *